(12) United States Patent
Kim et al.

(10) Patent No.: US 9,607,841 B2
(45) Date of Patent: Mar. 28, 2017

(54) SEMICONDUCTOR DEVICE AND METHOD OF FABRICATING THE SAME

(71) Applicant: Samsung Electronics Co., Ltd., Suwon-si (KR)

(72) Inventors: HyoJoong Kim, Seongnam-si (KR); Songha Oh, Suwon-si (KR); Changgoo Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 98 days.

(21) Appl. No.: 14/510,621

(22) Filed: Oct. 9, 2014

(65) Prior Publication Data

US 2015/0108561 A1 Apr. 23, 2015

(30) Foreign Application Priority Data

Oct. 17, 2013 (KR) .......................... 10-2013-0124143

(51) Int. Cl.
*H01L 21/76* (2006.01)
*H01L 21/28* (2006.01)
*H01L 29/423* (2006.01)
*H01L 29/66* (2006.01)
*H01L 27/11524* (2017.01)

(52) U.S. Cl.
CPC .. *H01L 21/28273* (2013.01); *H01L 27/11524* (2013.01); *H01L 29/42324* (2013.01); *H01L 29/66825* (2013.01)

(58) Field of Classification Search
USPC .................................. 438/587; 257/316, 315
See application file for complete search history.

(56) References Cited

U.S. PATENT DOCUMENTS

| 8,435,877 | B2 | 5/2013 | Yang et al. |
| 9,166,012 | B2 * | 10/2015 | Sim .................... H01L 29/42324 |
| 2007/0257305 | A1 | 11/2007 | Sasago et al. |
| 2009/0298257 | A1 | 12/2009 | Lee et al. |
| 2012/0037975 | A1 | 2/2012 | Cho et al. |
| 2012/0074484 | A1 | 3/2012 | Kang et al. |
| 2012/0122297 | A1 | 5/2012 | Na et al. |
| 2012/0132982 | A1 | 5/2012 | Lee et al. |
| 2012/0202335 | A1 | 8/2012 | Lee et al. |
| 2012/0211860 | A1 | 8/2012 | Takekida |
| 2013/0032871 | A1 | 2/2013 | Shin et al. |
| 2013/0056817 | A1 | 3/2013 | Kim et al. |

(Continued)

FOREIGN PATENT DOCUMENTS

| JP | 2010-003983 | 1/2010 |
| JP | 2010-225916 | 10/2010 |

(Continued)

*Primary Examiner* — Telly Green
(74) *Attorney, Agent, or Firm* — Myers Bigel, P.A.

(57) ABSTRACT

Provided is a semiconductor device and a method of fabricating the same. The method may include forming trenches in a substrate and lower gate patterns on the substrate between the trenches, forming sacrificial patterns filling the trenches, forming a porous insulating layer on the lower gate patterns to cover top surfaces of the sacrificial patterns, removing the sacrificial patterns through pores of the porous insulating layer to form air gaps surrounded by the trenches and the porous insulating layer, and forming a liner insulating layer on inner surfaces of the trenches through the pores of the porous insulating layer.

15 Claims, 15 Drawing Sheets

(56) References Cited

U.S. PATENT DOCUMENTS

2014/0151777 A1* 6/2014 Sim .................. H01L 29/42324
257/315

FOREIGN PATENT DOCUMENTS

| JP | 2011-204783 | | 10/2011 |
|----|-------------|---|---------|
| KR | 20090078101 A | * | 7/2009 |
| KR | 1020100013986 A | | 2/2010 |
| KR | 1020120026313 A | | 3/2012 |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0124143, filed on Oct. 17, 2013, in the Korean Intellectual Property Office, the entire contents of which are hereby incorporated by reference.

BACKGROUND OF THE INVENTION

Example embodiments of the inventive concept relate to a semiconductor device and a method of fabricating the same.

Integrated circuits have, to a large extent, followed Moore's law of increasing device density for decades. Increased density provides significant benefits to end-users in price, performance, portability, and reliability. However, as integrated circuits continue to pack more and more circuitry into a given area, some mechanisms threaten to diminish the devices' reliability. For example, as device density increases, adjacent cells may interfere with one another through a coupling mechanism.

SUMMARY

Example embodiments of the inventive concept provide a semiconductor device with improved reliability.

Other example embodiments of the inventive concept provide a simplified method of fabricating a semiconductor device.

According to example embodiments of the inventive concept, a method of fabricating a semiconductor device may include forming trenches in a substrate and lower gate patterns on the substrate between the trenches, forming sacrificial patterns filling the trenches, forming a porous insulating layer on the lower gate patterns to cover top surfaces of the sacrificial patterns, removing the sacrificial patterns through pores formed in the porous insulating layer to form air gaps surrounded by the trenches and the porous insulating layer, and forming a liner insulating layer on inner surfaces of the trenches through the pores of the porous insulating layer.

In example embodiments, the forming of the liner insulating layer may include supplying silicon source gas and reaction gas on the porous insulating layer. The silicon source and the reaction gas may pass through the pores and be reacted with each other on the inner surfaces of the trenches.

In example embodiments, the silicon source gas may be one of hexachloro disilane (HCD, $Si_2Cl_6$), dichlorosilane (DCS, $SiCl_2H_2$), tetraisocyanate silane (TICS, $Si(NCO)_4$), tetraethyl orthosilane (TEOS), silane ($SiH_4$), disilane ($Si_2H_6$), or trichlorosilane (TCS).

In example embodiments, the reaction gas may comprise oxygen or nitrogen gas.

In example embodiments, the liner insulating layer may be formed by a thermal CVD process or an ALD process.

In example embodiments, the porous insulating layer may be formed to have a thickness ranging from about 1 Å to about 40 Å.

In example embodiments, a thickness of the porous insulating layer may be further reduced after the forming of the liner insulating layer.

In example embodiments, the liner insulating layer may be formed to cover a sidewall of the porous insulating layer.

In example embodiments, the liner insulating layer may be thinner on the sidewall of the porous insulating layer than on the inner surfaces of the trenches.

In example embodiments, each of the lower gate patterns may include a tunnel insulating pattern and a floating gate pattern sequentially stacked on the substrate, and a top surface of the sacrificial pattern may be positioned at a level higher than a top surface of the tunnel insulating pattern relative to the substrate.

According to example embodiments of the inventive concept, a semiconductor device may include a substrate including active regions defined by trenches, lower gate patterns on the active regions, a porous insulating pattern between the lower gate patterns, the porous insulating pattern partially covering sidewalls of the lower gate patterns, a liner insulating layer conformally covering an inner surface of the trench and portions of the sidewalls of the lower gate patterns, an air gap between the active regions, the air gap being delimited by a bottom surface of the porous insulating pattern and the liner insulating layer, liner insulating patterns covering sidewalls of the porous insulating pattern, and an upper gate pattern disposed on the lower gate patterns to cross the active regions.

In example embodiments, the liner insulating layer and the liner insulating patterns may include the same material.

In example embodiments, the liner insulating layer and the liner insulating patterns may include a silicon oxide layer or a silicon nitride layer.

In example embodiments, the liner insulating layer may be thicker than the liner insulating patterns.

In example embodiments, the semiconductor device may further include a buried insulating pattern filling a gap region between the liner insulating patterns, and a blocking insulating pattern interposed between the lower gate patterns and the upper gate pattern to cover a top surface of the buried insulating pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 8 is an enlarged sectional view of a portion A of FIG. 7 to illustrate a method of fabricating a semiconductor device, according to example embodiments of the inventive concept.

FIG. 11 is an enlarged sectional view of a portion B of FIG. 10 to illustrate a method of fabricating a semiconductor device, according to example embodiments of the inventive concept.

Figure 1:
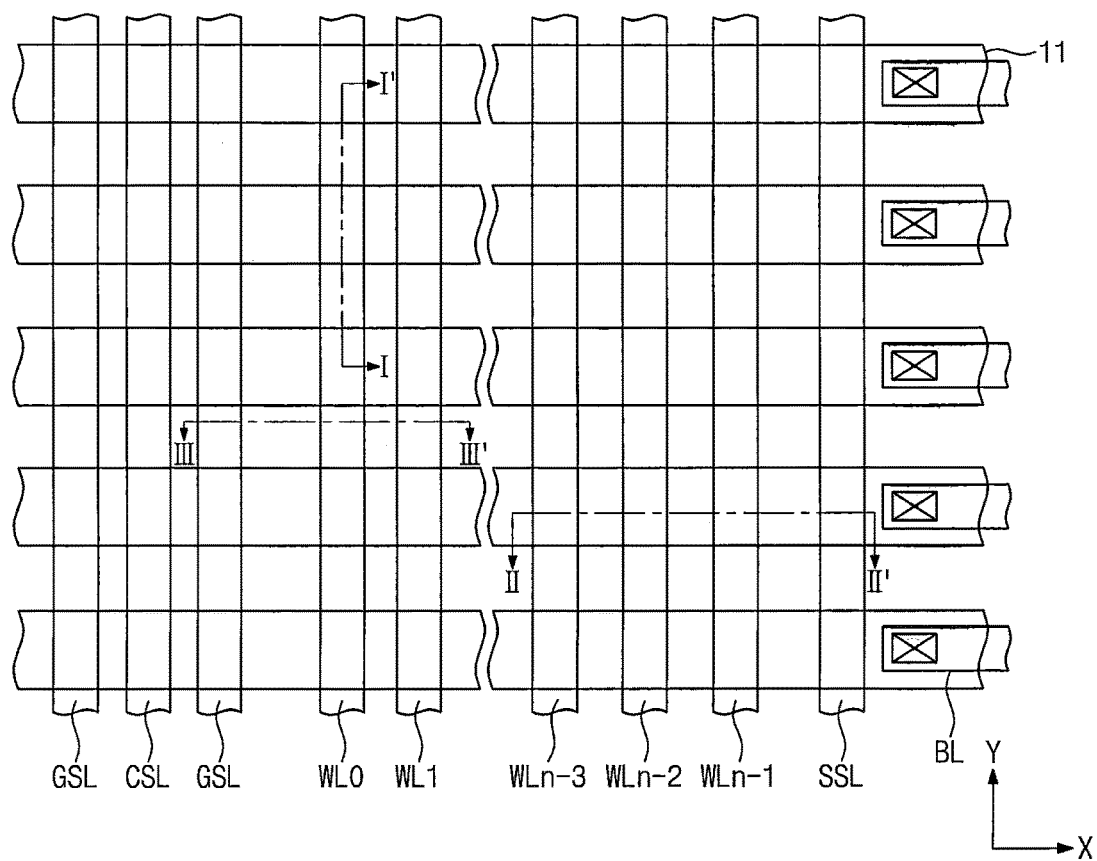
FIG. 1 is a plan view illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

Figure 2:
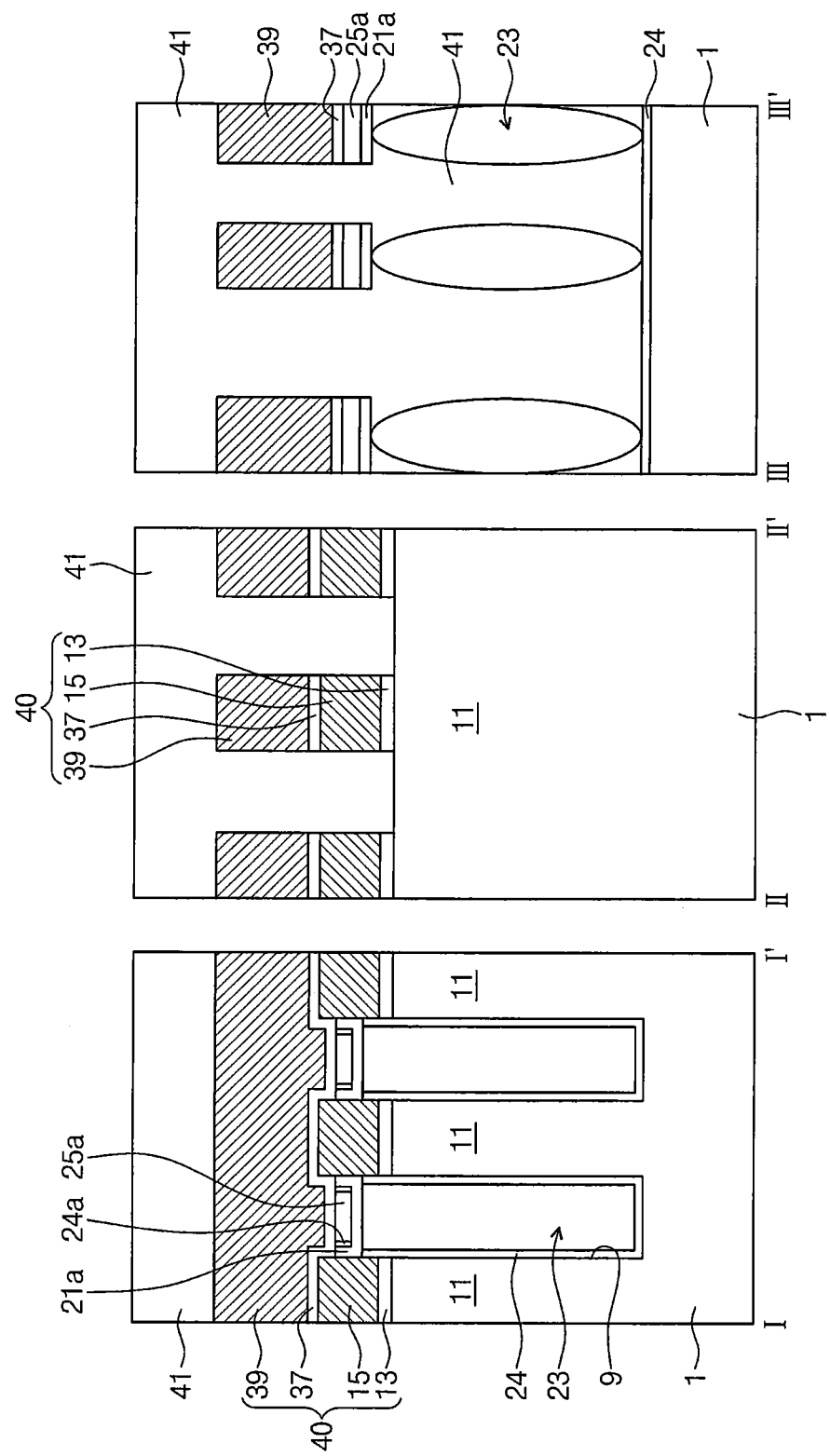
FIG. 2 is a sectional view taken along lines I-I', II-II', and III-III', respectively, of FIG. 1 to illustrate a semiconductor device according to example embodiments of the inventive concept.

FIG. 1 is a plan view illustrating a semiconductor device according to example embodiments of the inventive concept. FIG. 2 is a sectional view taken along lines I-I', II-II', and III-III', respectively, of FIG. 1 to illustrate a semiconductor device according to example embodiments of the inventive concept.

Referring to FIGS. 1 and 2, tunnel insulating patterns 13 and floating gate patterns 15 may be sequentially provided on a substrate 1. The tunnel insulating patterns 13 may be formed of or include a silicon oxide layer. For example, the tunnel insulating patterns 13 may be a thermal oxide layer. The tunnel insulating patterns 13 may be configured in such a way that electric charges can be injected from the substrate 1 to the floating gate patterns 15 through FN tunneling, when a flash memory device is operated.

The floating gate patterns 15 may be formed of or include a polysilicon layer doped with p-type or n-type impurities. For example, at least one of boron, aluminum, and gallium may be used as the p-type impurities, and at least one of phosphorus, arsenic, bismuth, and antimony may be used as the n-type impurities. For the FLASH memory device, the electric charges tunneling through the tunnel insulating patterns 13 may be trapped in the floating gate patterns 15.

Porous insulating patterns 21a may be disposed between the floating gate patterns 15. The porous insulating patterns 21a may be provided to cover a portion of a sidewall of the floating gate patterns 15. The porous insulating patterns 21a may have a bottom surface located at a level higher than a top surface of the tunnel insulating pattern 13. In the porous insulating patterns 21a, pores may be provided in a volume ratio of about 5% to about 50%. In certain embodiments, the porous insulating patterns 21a may be formed of a material having a higher etch rate than blocking insulating patterns 37 in a wet etching process using HF solution. For example, the porous insulating patterns 21a may have an etch rate of about 100 Å/min to about 200 Å/min, when 200:1 hydrofluoric acid diluted with de-ionized water may be used in the wet etching process. The porous insulating patterns 21a may have a thickness of about 40 Å or less.

Liner insulating patterns 24a may be disposed to cover inner sidewalls of the porous insulating patterns 21a. The liner insulating patterns 24a may be formed of or include a silicon oxide layer or a silicon nitride layer.

Buried insulating patterns 25a may be provided to cover the bottom surface of the porous insulating patterns 21a and fill gap regions between the liner insulating patterns 24a. The buried insulating patterns 25a may be formed of or include a silicon oxide layer having a generally good gapfill property (e.g., a spin-on-glass (SOG) oxide layer).

Trenches 9 may be formed in portions of the substrate 1 positioned between the tunnel insulating patterns 13 to extend along a first direction (X direction). A liner insulating layer 24 may be formed to conformally cover side and bottom surfaces of the trenches 9. The liner insulating layer 24 may extend to cover sidewalls of the tunnel insulating patterns 13 and the floating gate patterns 15 provided below the porous insulating patterns 21a. The liner insulating layer 24 may be formed of or include the same material as the liner insulating patterns 24a. The liner insulating layer 24 may have a larger thickness than the liner insulating patterns 24a.

Air gaps 23 may be provided in the trenches 9 and be enclosed by the liner insulating layer 24. For example, side and bottom surfaces of the air gaps 23 may be defined by the liner insulating layer 24, and top surfaces of the air gaps 23 may be defined by bottom surfaces of the porous insulating patterns 21a. The air gaps 23 may be a region filled with gas or a vacuum-like region, and thus, the permittivity thereof may be close to about 1 that is lower than the permittivity (e.g., 3.9-4.2) of the silicon oxide layer. The generally low permittivity of the air gaps 23 makes it possible to reduce cell-to-cell coupling or interference.

Portions of the substrate 1 positioned between the trenches 9 may be used or defined as active regions 11. The active regions 11 may extend parallel to the first direction.

The blocking insulating patterns 37 may be provided on the floating gate patterns 15. The blocking insulating patterns 37 may be formed to cover top surfaces of the buried insulating patterns 25a. Each of the blocking insulating patterns 37 may include or be formed of an oxide layer having a thickness larger than the tunnel insulating pattern 13, a stack including a lower oxide layer, a nitride layer, and an upper oxide layer, or a high-k dielectric layer.

Control gate patterns 39 may be provided on the blocking insulating patterns 37 to cross the active regions 11. The control gate patterns 39 may be formed of the same material as the floating gate patterns 15 and be doped to have the same conductivity type as the floating gate patterns 15.

Each of the cell gate structures 40 may include the tunnel insulating pattern 13, the floating gate pattern 15, the blocking insulating pattern 37, and the control gate pattern 39. The cell gate structures 40 may include a plurality of cell gate electrodes WL0-WLn−1, at least one ground selection gate electrode GSL, and at least one string selection gate electrode SSL, which are disposed to cross the active regions 11. The cell gate electrodes WL0-WLn−1, the ground selection gate electrode GSL, and the string selection gate electrode SSL may extend parallel to a second direction or Y direction crossing the first direction or the X direction, and the cell gate electrodes WL0-WLn−1 may be provided between the ground and string selection gate electrodes GSL and SSL. A common string line CSL may be provided between an adjacent pair of the ground selection gate electrodes GSL and extend parallel to the second direction or Y direction. Bit lines BL may extend along the first direction or X direction, and each of them may be connected to a corresponding one of source and drain regions (not shown) adjacent to the string selection line SSL.

Figure 7:
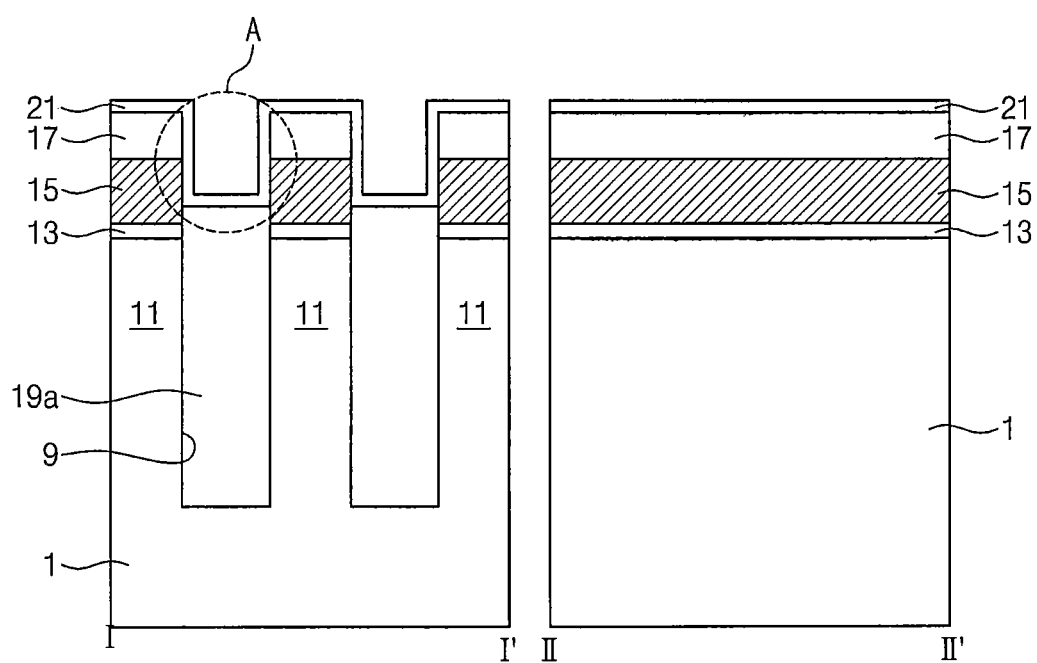
Figure 8:
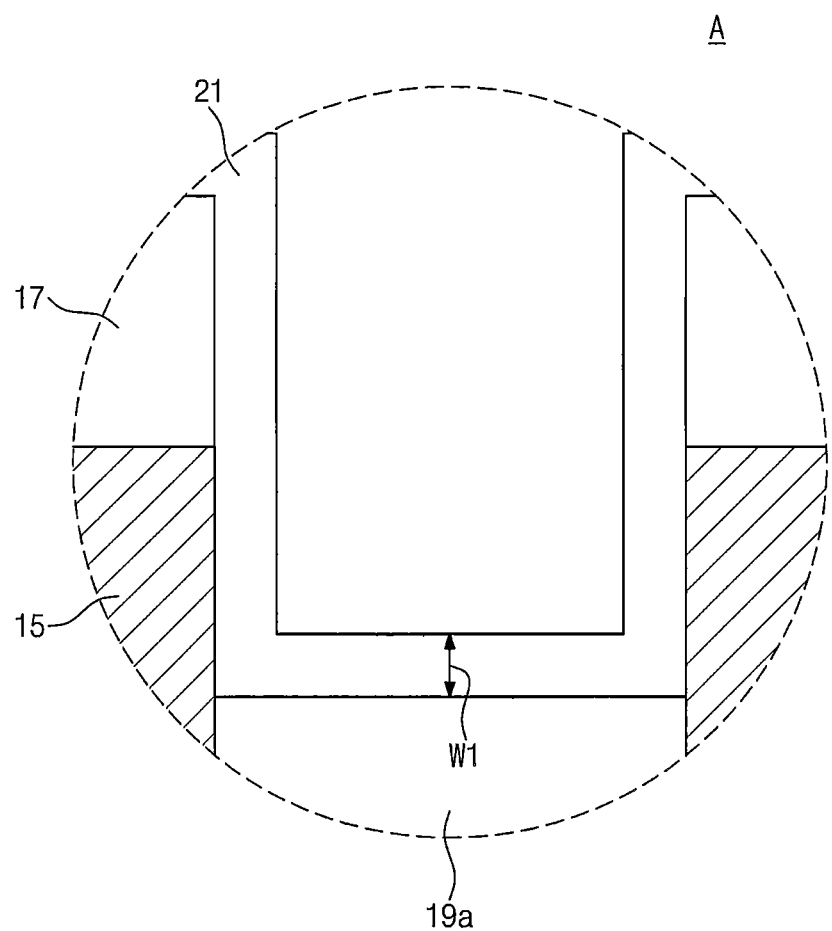

FIGS. 3 through 17 are sectional views illustrating a method of fabricating a semiconductor device according to example embodiments of the inventive concept. FIG. 8 is an enlarged sectional view of a portion A of FIG. 7, and FIG. 11 is an enlarged sectional view of a portion B of FIG. 10.

Figure 3:
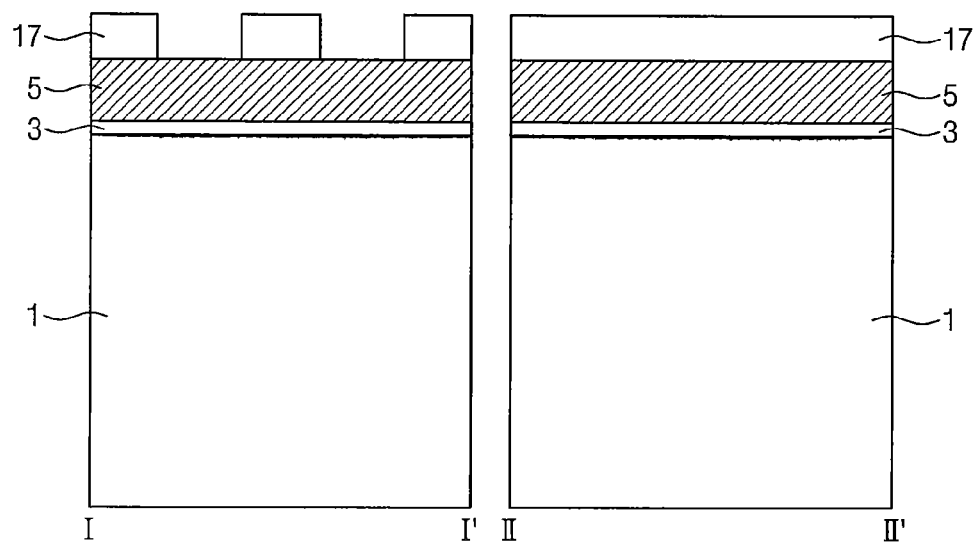
FIGS. 3 through 17 are sectional views illustrating a method of fabricating a semiconductor device according to example embodiments of the inventive concept.

Referring to FIG. 3, a substrate 1 may be provided. The substrate 1 may be, for example, a bulk silicon wafer, a silicon-on-insulator (SOI) wafer, a germanium wafer, a germanium-on-insulator wafer, a silicon-germanium wafer, or a substrate including an epitaxial layer.

A tunnel insulating layer 3 and a floating gate layer 5 may be sequentially formed on the substrate 1. The tunnel insulating layer 3 may be a silicon oxide layer, which may be formed by, for example, a thermal oxidation process. The floating gate layer 5 may be a polysilicon layer. The floating gate layer 5 may be doped with impurities (e.g., boron or phosphorus). The impurities may be doped into the floating gate layer 5 by an ion-implantation process or an impurity-diffusion process. The floating gate layer 5 may be formed by a chemical vapor deposition, physical vapor deposition, or atomic layer deposition process.

Hard mask patterns 17 may be formed on the floating gate layer 5. The hard mask patterns 17 may include or be formed of an insulating material.

Figure 4:
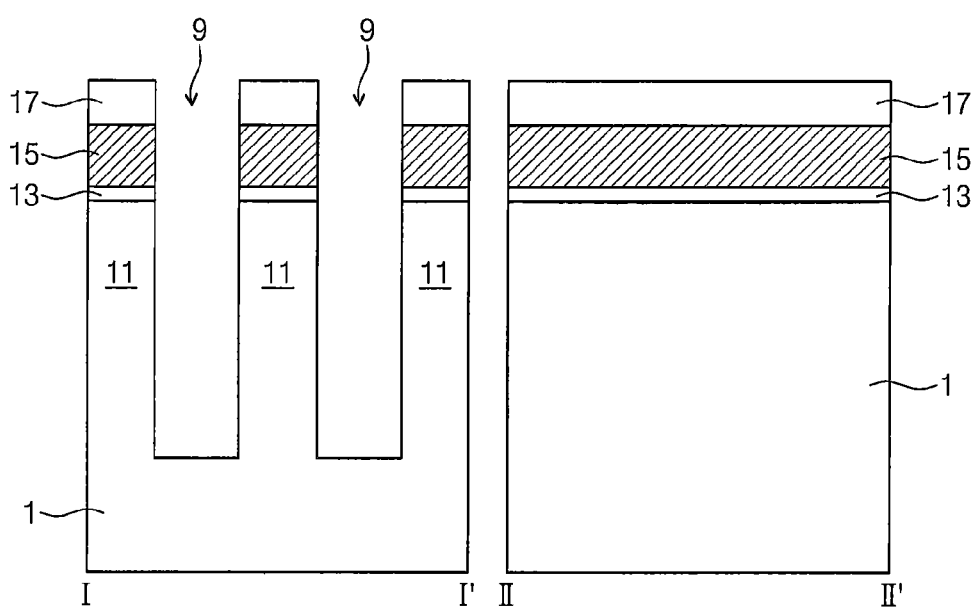

Referring to FIG. 4, the floating gate layer 5, the tunnel insulating layer 3 and the substrate 1 may be patterned using the hard mask patterns 17 as an etch mask to form tunnel insulating patterns 13 and floating gate patterns 15 delimited by trenches 9. For example, the tunnel insulating patterns 13 and the floating gate patterns 15 may be formed on active regions 11 of the substrate 1 defined by the trenches 9. The trenches 9 and the active regions 11 may extend parallel to the first or X direction.

Figure 5:
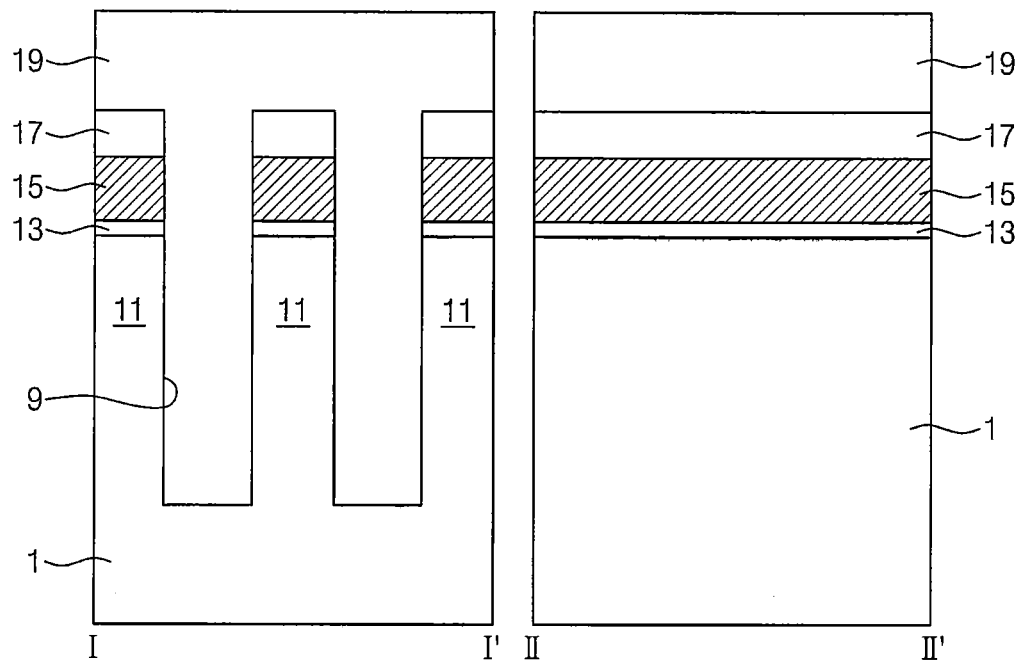

Referring to FIG. 5, a sacrificial layer 19 may be formed on the substrate 1 to fill the trenches 9. The sacrificial layer 19 may include or be formed of, for example, a spin-on-hardmask (SOH) layer, an amorphous carbon layer (ACL), or a hydrocarbon-based insulating layer.

Figure 6:
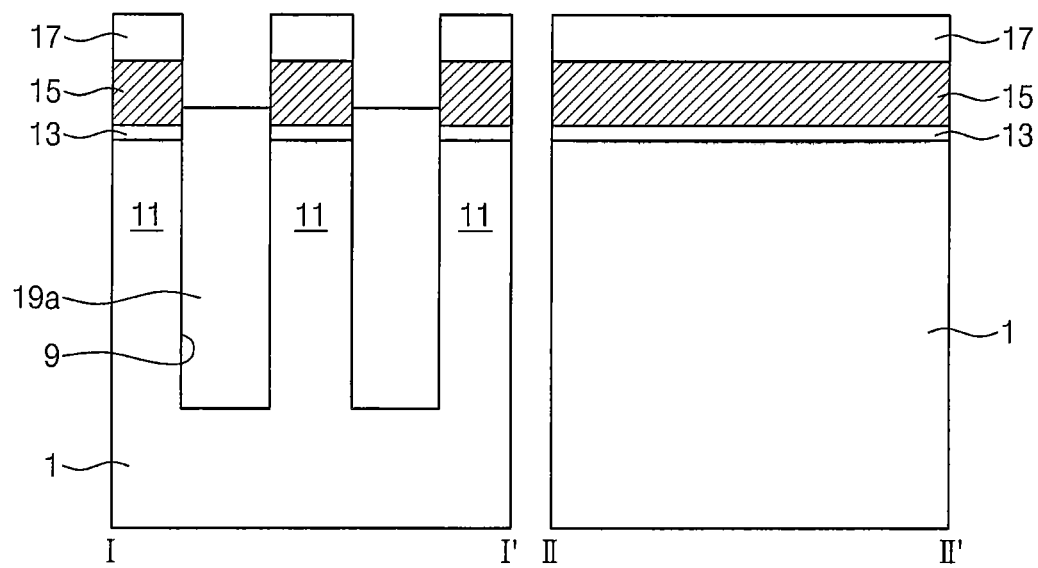

Referring to FIG. 6, an etching process may be performed to the sacrificial layer 19 to form sacrificial patterns 19a in the trenches 9. The etching process may be performed in an etch-back manner. The sacrificial patterns 19a may be formed to expose side surfaces of the hard mask patterns 17 and the floating gate patterns 15. In certain embodiments, the sacrificial patterns 19a may be formed to have top surfaces positioned at a higher level than those of the tunnel insulating patterns 13 relative to the substrate 1. The vertical level of the top surfaces of the sacrificial patterns 19a may be adjusted to control a vertical position of a top surface of air gaps 23.

Referring to FIGS. 7 and 8, a porous insulating layer 21 may be formed on the sacrificial patterns 19a. The porous insulating layer 21 may be formed to cover conformally the structure with the sacrificial patterns 19a. In certain embodiments, the porous insulating layer 21 may be formed to have a deposition thickness W1 of about 1 Å to about 40 Å. In the case where the porous insulating layer 21 is formed to have a thickness of 40 Å or larger, it may be difficult to form a liner insulating layer 24 in a subsequent process. The porous insulating layer 21 may be formed by forming a carbon-containing silicon oxide layer and then performing a thermal treatment process thereto. During the thermal treatment process, carbon atoms contained in the silicon oxide layer may be bonded with silicon atoms, thereby forming a cage-like structure, whose density is lower than that of $SiO_2$. For example, SiCOH may be an example of materials having the cage-like structure. A SiCOH layer may be formed using trimethylsilane (3MS; $CH_{33}$—Si—H), tetramethylsilane (MS; $CH_{34}$—Si), vinyltrimethylsilane (VTMS; $CH_2$=CH—$Si(CH_3)_3$) as precursor. The formation of the SiCOH layer may further include oxidizing the precursor (for example, using oxidant gas containing oxygen). The oxidant gas may be, for example, hydrogen peroxide gas. In the porous insulating layer 21, pores may be provided in a volume ratio of about 5% to about 50%. In example embodiments, the porous insulating layer 21 may be formed to have an etch rate greater than that of the blocking insulating patterns, when they are etched in a wet etching manner using an HF etching solution. For example, the etch rate of the porous insulating layer 21 may range from about 100-200 Å/min, when the wet etching process is performed using a 200:1 dilute HF solution. The porous insulating layer 21 may be formed using an ALD or plasma-enhanced CVD (PECVD) process.

Figure 9:
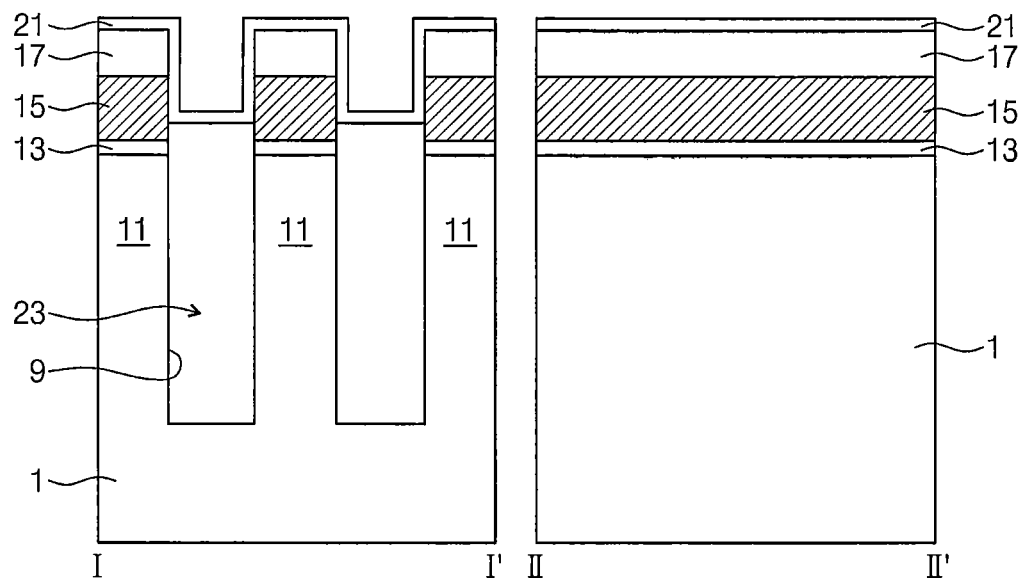

Referring to FIG. 9, the sacrificial patterns 19a may be selectively removed through the pores of the porous insulating layer 21. Accordingly, air gaps 23 may be formed in the trenches 9, and inner surfaces of the trenches 9 may be exposed by the air gaps 23. Each of the air gaps 23 may be a region delimited by the inner surface of the trench 9, the side surface of the tunnel insulating pattern 13, a portion of the side surface of the floating gate pattern 15, and the bottom surface of the porous insulating layer 21 and be filled with air or gas. In the case where the sacrificial patterns 19a are formed of an SOH layer, the sacrificial patterns 19a may be removed by an ashing process using oxygen, ozone, or ultraviolet (UV), or a wet etching process. In the case where the sacrificial patterns 19a are formed of an amorphous carbon layer, the sacrificial patterns 19a may be isotropically removed using chlorine gas.

Figure 10:
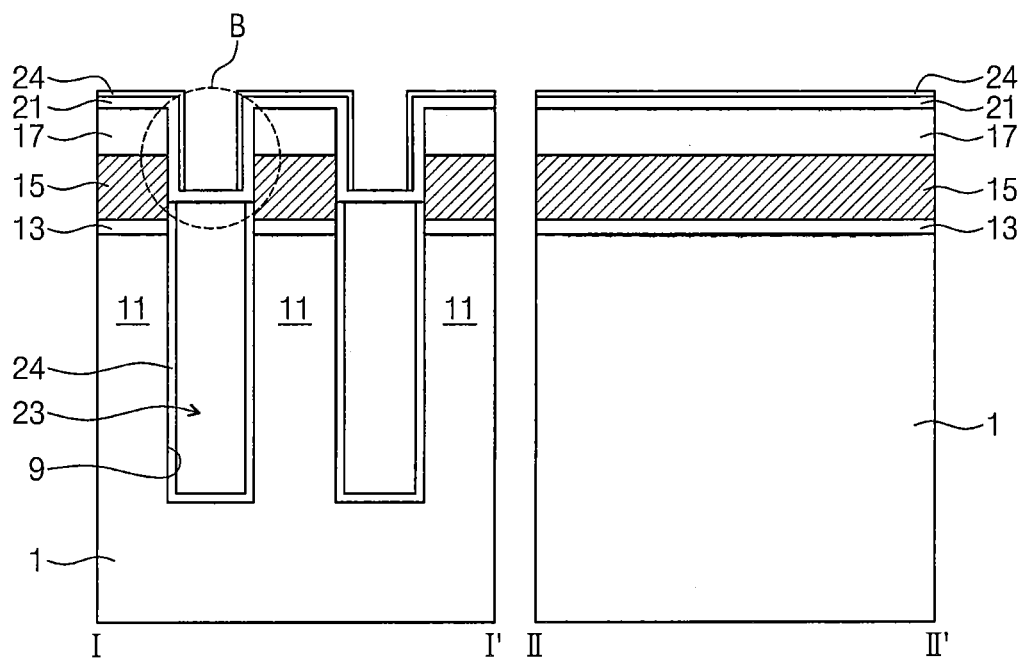
Figure 11:
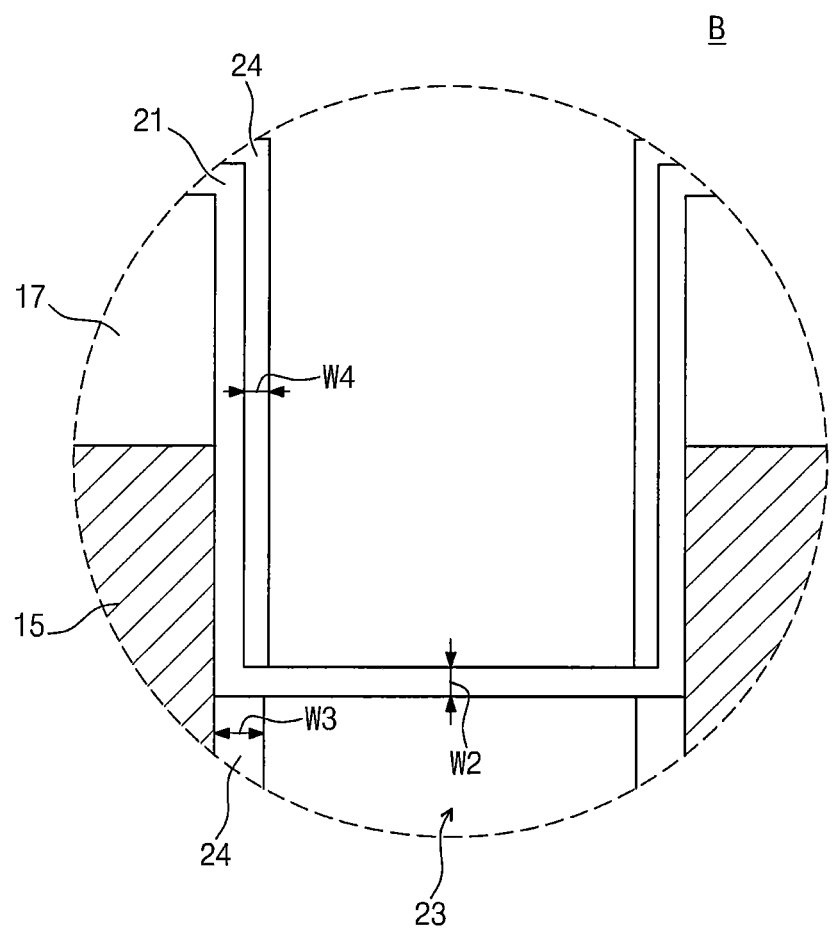

Referring to FIG. 10, a liner insulating layer 24 may be formed to conformally cover inner surfaces of the air gaps 23 through the pores of the porous insulating layer 21. For example, the liner insulating layer 24 may cover the inner surfaces of the trenches 9, the side surfaces of the tunnel insulating patterns 13, and portions of the side surfaces of the floating gate patterns 15. In certain embodiments, the formation of the liner insulating layer 24 may include providing silicon source gas and reaction gas on the porous insulating layer 21, and in this case, the silicon source gas and the reaction gas may pass through the pores of the porous insulating layer 21 and be reacted with each other on the inner surfaces of the air gaps 23. The reaction gas may be oxygen gas or nitrogen gas. The liner insulating layer 24 may be formed using a thermal CVD process or an ALD process. The liner insulating layer 24 may be a silicon oxide layer or a silicon nitride layer.

In the case where the liner insulating layer 24 is formed by the thermal CVD process, the silicon source gas may be, for example, silane ($SiH_4$), disilane ($Si_2H_6$), dichlorosilane (DCS; $SiCl_2H_2$), trichlorosilane (TCS), or hexachloro disilane (HCD; $Si_2Cl_6$), the oxygen gas may be, for example, $N_2O$, NO, or $O_2$, and the nitrogen gas may be, for example, ammonia ($NH_3$) gas. In certain embodiments, the thermal CVD process may be performed at a temperature of about 500° C. or higher.

In the case where the liner insulating layer 24 is formed by the ALD process, the silicon source gas may be, for example, hexachloro disilane (HCD; $Si_2Cl_6$), dichlorosilane (DCS; $SiCl_2H_2$), tetra isocyanate silane (TICS; $Si(NCO)_4$), or tetraethyl orthosilane (TEOS), and the oxygen gas may be, for example, $H_2O$, $O_3$, or $H_2O_2$. When the silicon source and the oxygen gas are provided, pyridine may be provided as a catalyst. In certain embodiments, the ALD process may be performed at a temperature of about 100-200° C. or lower.

The liner insulating layer 24 may be formed on the side and top surfaces of the porous insulating layer 21. Referring to FIG. 11, the liner insulating layer 24 may have a thickness W3 in the air gaps 23 and a thickness W4 smaller than W3 on the side and top surfaces of the porous insulating layer 21. Accordingly, a sum of a thickness W2 of the porous insulating layer 21 and the thickness W4 of the liner insulating layer 24 on the porous insulating layer 21 may be less than a sum of the thickness W2 of the porous insulating layer 21 and the thickness W3 of the liner insulating layer 24 in the air gaps 23.

A molecular structure of the porous insulating layer 21 may be changed by heat applied during the process of forming the liner insulating layer 24. For example, a mean size or the number of the pores may be decreased, and thus, the porous insulating layer 21 may have an increased density. As the result of the increase in density of the porous insulating layer 21, the thickness W2 of the porous insulating layer 21 after the formation of the liner insulating layer 24 may be smaller than that (e.g., thickness W1) before the formation of the liner insulating layer 24.

By forming the liner insulating layer 24, it is possible to support the cells and to reduce or prevent impurity ions (e.g., boron (B)) doped regions from being diffused. In the case where the liner insulating layer 24 is formed on sidewalls of the trenches 9 before the formation of the sacrificial layer 19, a width of the air gap 23 may be dependent on a thickness of the liner insulating layer 24. Accordingly, if the thickness of the liner insulating layer 24 varies depending on a position of the trench 9, the air gaps 23 may be formed to have non-uniform sizes and this may lead to a positional difference in terms of cell-to-cell coupling or interference and a process failure of the semiconductor device.

By contrast, according to example embodiments of the inventive concept, the liner insulating layer 24 may be formed through the pores of the porous insulating layer 21, after the formation of the air gaps 23, and thus, it is possible to reduce the non-uniformity in size of the air gaps 23 and consequently the process failure. In addition, a density of the porous insulating layer 21 can be increased through a process of forming the liner insulating layer 24. Accordingly, it is unnecessary to perform an additional densification process to the porous insulating layer 21, and thus, it is possible to reduce or prevent exposure or breakage of the air gaps 23, which may occur when a deposition gas to be used in a subsequent process is injected or exhausted into the air gaps 23.

Figure 12:
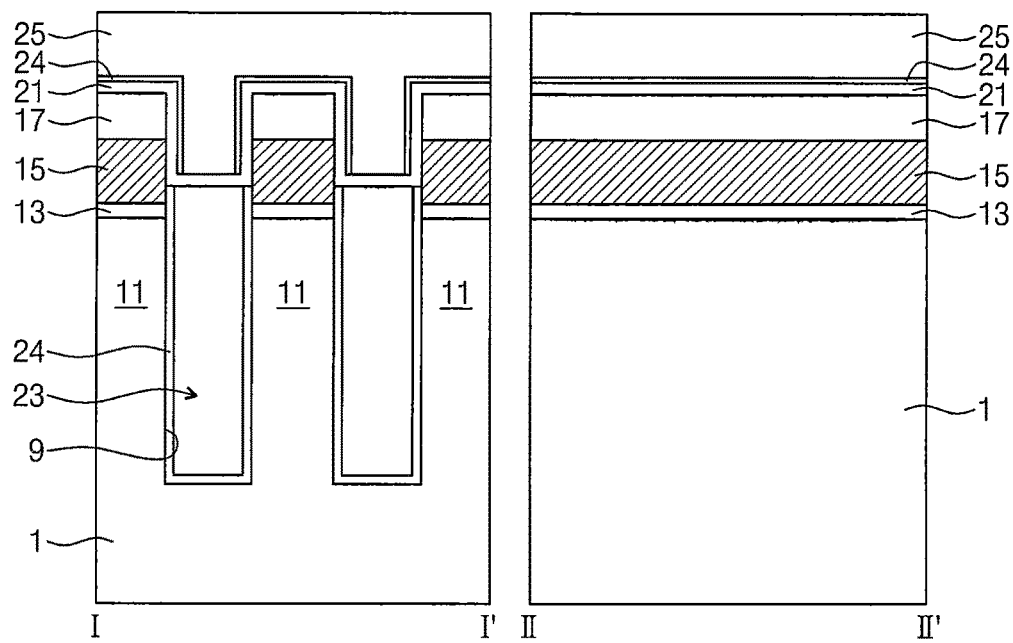

Referring to FIG. 12, an insulating gapfill layer 25 may be formed on the substrate 1 to cover the top surface of the porous insulating layer 21. The insulating gapfill layer 25 may be formed to fill regions between the hard mask patterns 17, whose sidewalls are covered with the liner insulating layer 24. The insulating gapfill layer 25 may be a silicon oxide layer (e.g., SOG oxide, TOSZ) having a generally good gapfill property.

Figure 13:
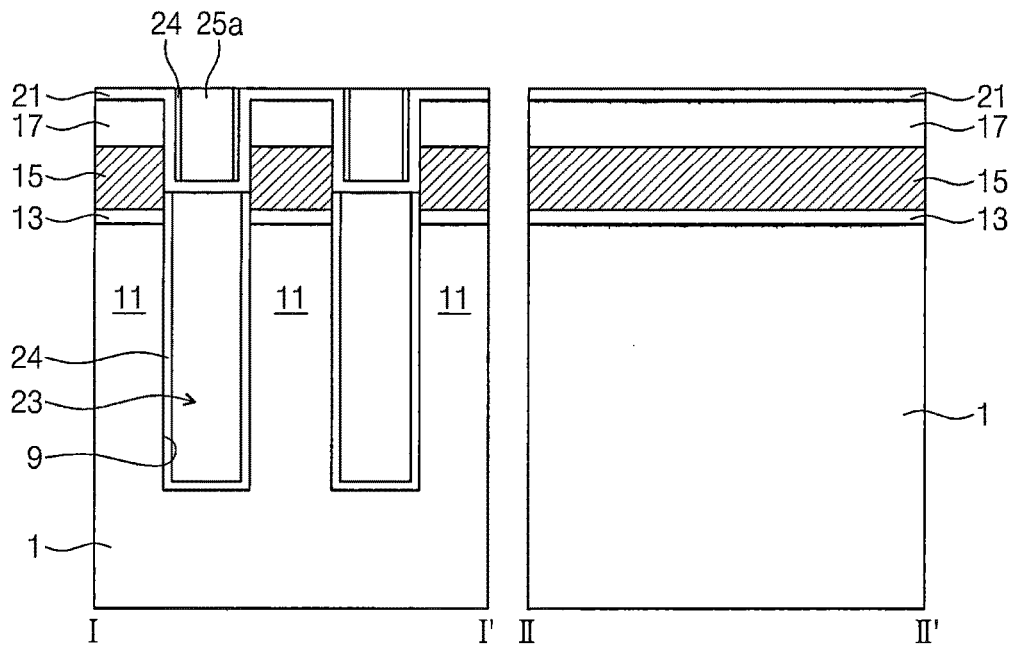

Referring to FIG. 13, a planarization process may be performed to the insulating gapfill layer 25 to expose the top surface of the porous insulating layer 21 and form buried insulating patterns 25a between the liner insulating layer 24.

Figure 14:
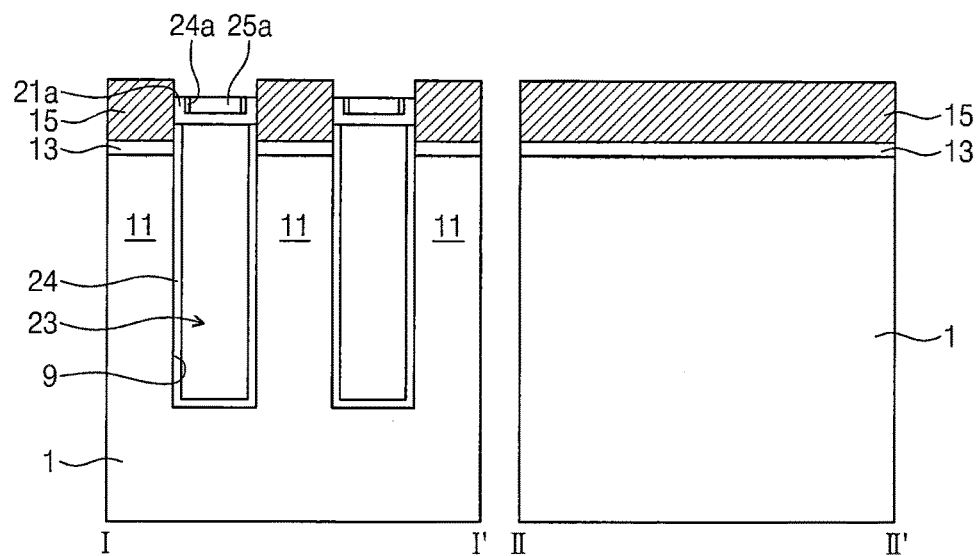

Referring to FIG. 14, the hard mask patterns 17 may be removed to expose the top surfaces of the floating gate patterns 15. For example, an etching process may be performed to remove the hard mask patterns 17, and during this process, the liner insulating layer 24, the porous insulating layer 21, and the buried insulating patterns 25a may be removed from the top surfaces of the hard mask patterns 17 to partially expose the sidewalls of the floating gate patterns 15. Accordingly, porous insulating patterns 21a and liner insulating patterns 24a may be formed on the air gaps 23. The porous insulating patterns 21a, the liner insulating patterns 24a, and the buried insulating patterns 25a may have top surfaces that are generally coplanar with each other.

Figure 15:
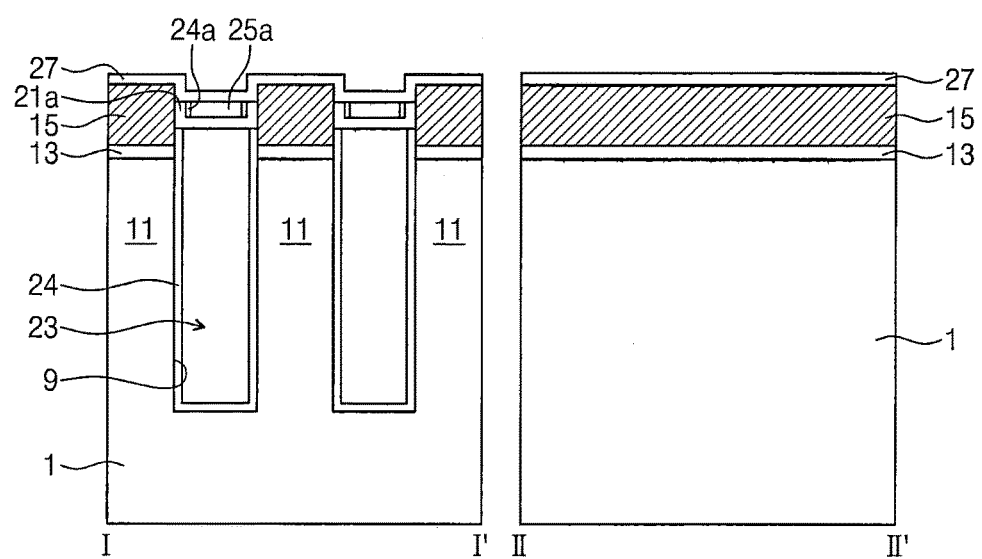

Referring to FIG. 15, a blocking insulating layer 27 may be conformally formed on the floating gate patterns 15. The blocking insulating layer 27 may extend along the exposed sidewalls of the floating gate patterns 15 and cover the top surfaces of the buried insulating patterns 25a. The blocking insulating layer 27 may be formed of or include an oxide layer, whose thickness is larger than that of the tunnel insulating layer 3, or an ONO layer including a lower oxide layer, a nitride layer, and an upper oxide layer. The blocking insulating layer 27 may include a high-k dielectric layer. For example, the high-k dielectric may include or be formed of at least one insulating metal oxide (e.g., hafnium oxide or aluminum oxide).

Figure 16:
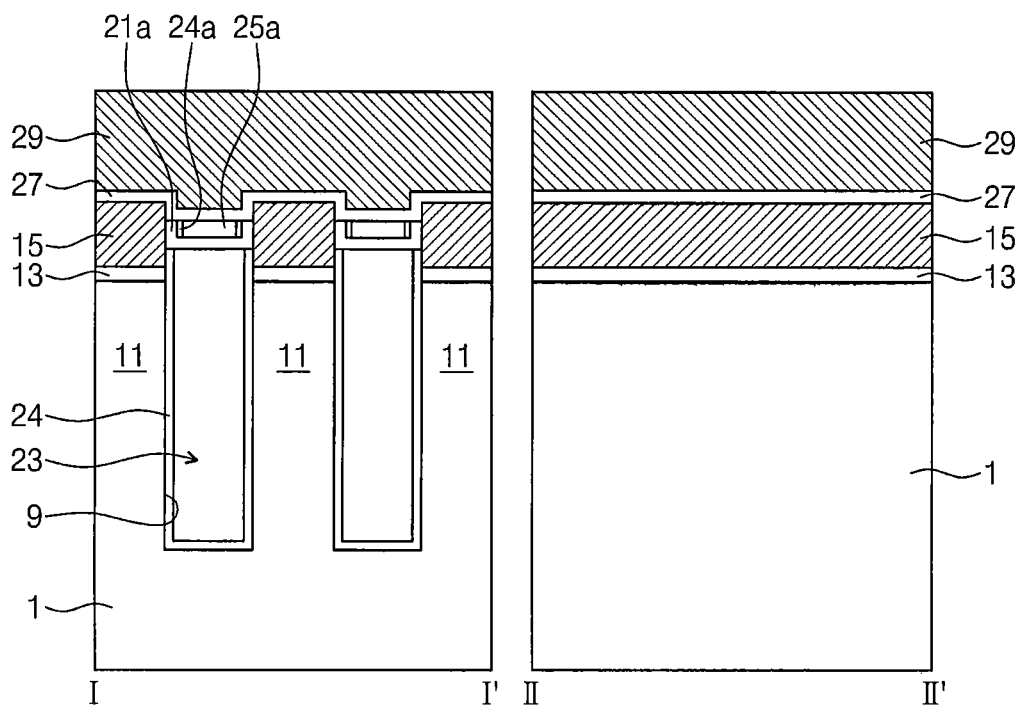

Referring to FIG. 16, a control gate layer 29 may be formed on the blocking insulating layer 27. The control gate layer 29 may be formed by a chemical vapor deposition, physical vapor deposition, or ALD process. The control gate layer 29 may be formed of or include a polysilicon layer.

Figure 17:
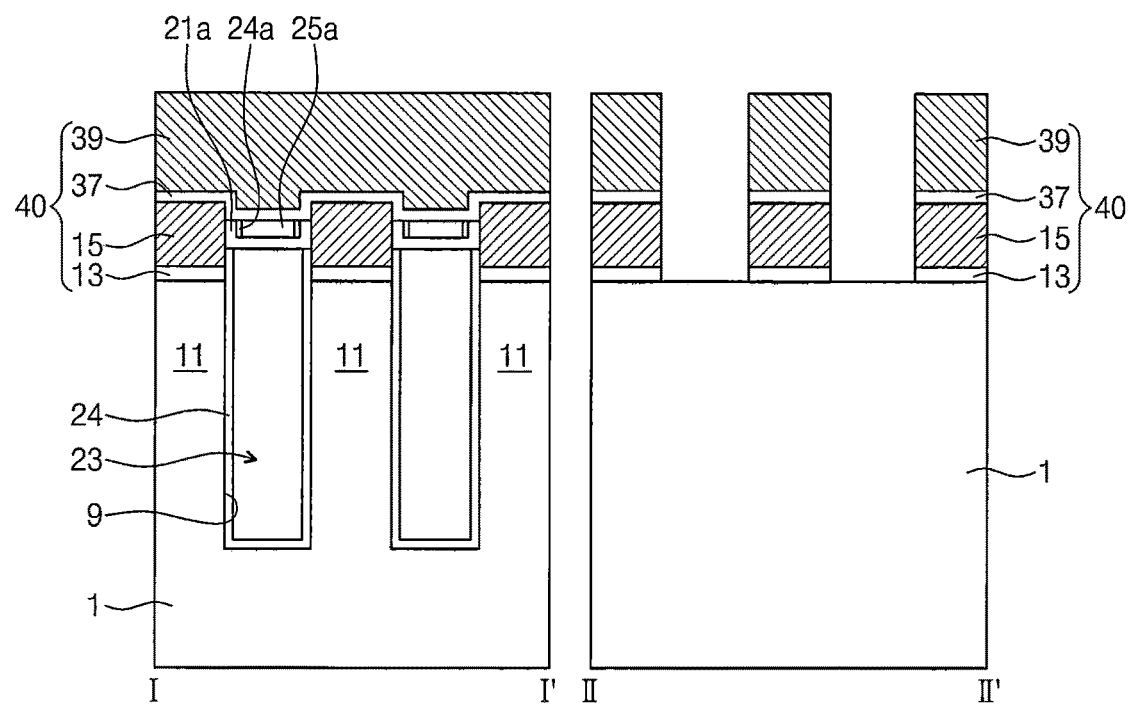

Referring to FIG. 17, the control gate layer 29 and the blocking insulating layer 27 may be sequentially patterned to form control gate patterns 39 and blocking insulating patterns 37. The control gate patterns 39 and the blocking insulating patterns 37 may be formed to extend along the second or Y direction. Cell gate structures 40 may be formed on the substrate 1, and each of the cell gate structures 40 may include the tunnel insulating pattern 13, the floating gate pattern 15, the blocking insulating pattern 37, and the control gate pattern 39.

Referring back to FIG. 2, an interlayered insulating layer 41 may be formed on the substrate 1 with the cell gate structures 40. The interlayered insulating layer 41 may be formed to have a generally poor step coverage property. The interlayered insulating layer 41 may be formed to fill gap regions between the cell gate structures 40. In certain embodiments, the interlayered insulating layer 41 may be formed not to fill the air gaps 23 provided below the cell gate structures 40. Accordingly, the air gaps 23 may be enclosed by the interlayered insulating layer 41.

After the formation of the interlayered insulating layer 41, contact plugs (not shown) may be formed to penetrate the interlayered insulating layer 41 and be in contact with source and drain regions (not shown), and bit lines (not shown) may be formed on the interlayered insulating layer 41 and be electrically connected to the contact plugs.

Figure 18:
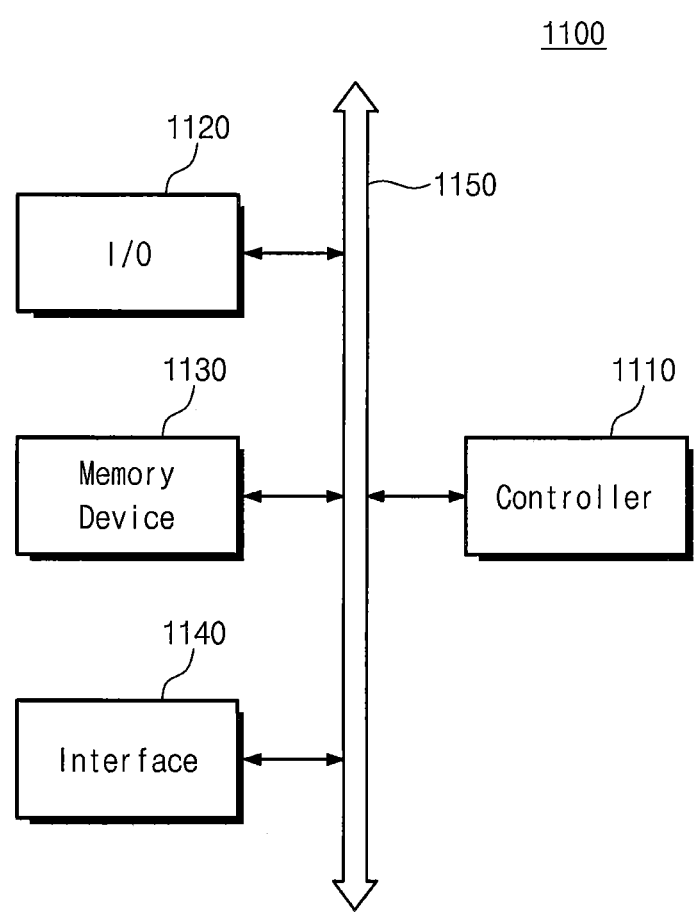
FIG. 18 is a schematic block diagram illustrating an example of electronic systems including a semiconductor device according to example embodiments of the inventive concept.

FIG. 18 is a schematic block diagram illustrating an example of electronic systems including a semiconductor device according to example embodiments of the inventive concept.

Referring to FIG. 18, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the input-output unit 1120, the memory device 1130, and/or the interface 1140 may be configured to include one or more semiconductor devices according to example embodiments of the inventive concept.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to or used in a personal digital assistant (PDA), a portable computer, a web tablet, a wireless phone, a mobile phone, a digital music player, a memory card or an electronic product. The electronic product may receive or transmit information data wirelessly.

Figure 19:
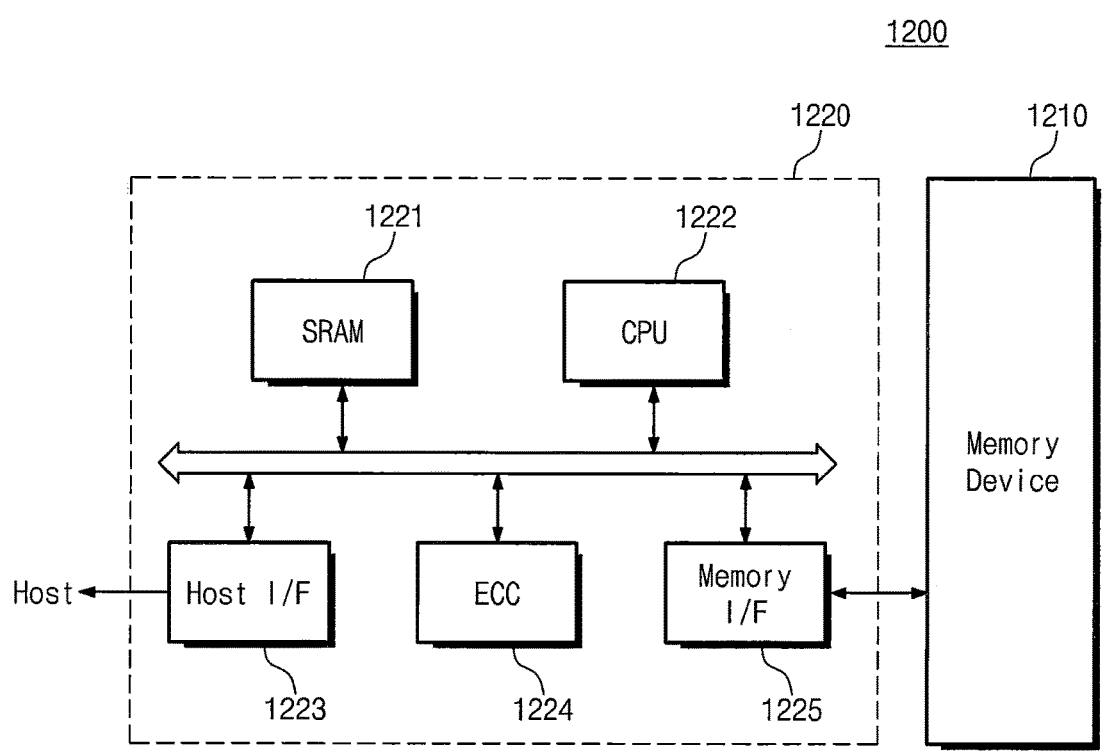
FIG. 19 is a schematic block diagram illustrating an example of memory cards including the semiconductor memory devices according to the embodiments of the inventive concept.

FIG. 19 is a schematic block diagram illustrating an example of memory cards including the semiconductor memory devices according to the embodiments of the inventive concept.

Referring to FIG. 19, a memory card 1200 according to example embodiments of the inventive concept may include a memory device 1210. The memory device 1210 may include at least one of the semiconductor memory devices according to the afore-described embodiments of the inventive concept. In other embodiments, the memory device 1210 may further include a semiconductor memory device, which is of a different type from the semiconductor memory devices according to the afore-described embodiments of the inventive concept. For example, the memory device 1210 may further include a nonvolatile memory device and/or a static random access memory (SRAM) device. The memory card 1200 may include a memory controller 1220 that controls data communication between a host and the memory device 1210. The memory device 1210 and/or the memory controller 1220 may be configured to include at least one of the semiconductor devices according to example embodiments of the inventive concept.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data, which are read out from the memory device 1210. The memory card 1200 may further include a read only memory (ROM) device that stores code data to interface with the host. The memory card 1200 may be used as a portable data storage card. Alternatively, the memory card 1200 may be provided in the form of solid state disks (SSD), instead of hard disks of computer systems.

Figure 20:
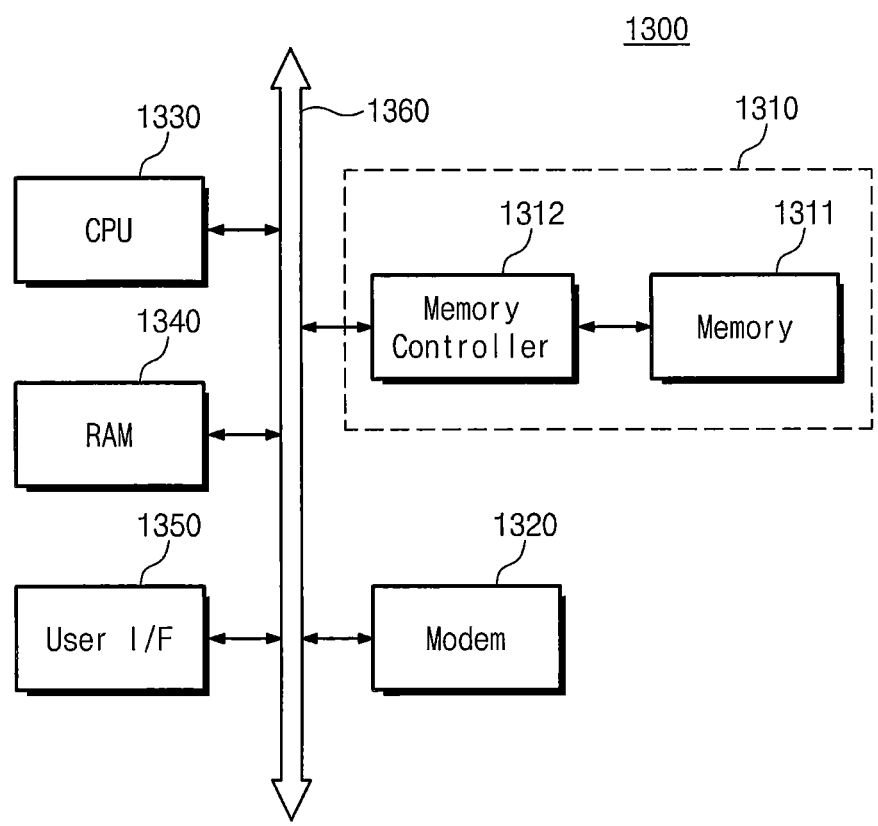
FIG. 20 is a schematic block diagram illustrating an example of information processing systems including a semiconductor device according to example embodiments of the inventive concept.

FIG. 20 is a schematic block diagram illustrating an example of information processing systems including a semiconductor device according to example embodiments of the inventive concept.

Referring to FIG. 20, an information processing system 1300 includes a memory system 1310, which may include at least one of the semiconductor devices according to example embodiments of the inventive concept. The information processing system 1300 also includes a modem 1320, a central processing unit (CPU) 1330, a RAM 1340, and a user interface 1350, which may be electrically connected to the memory system 1310 via a system bus 1360. The memory system 1310 may have the same configuration as that of the memory card 1200 of FIG. 19. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may be provided as a solid state drive SSD, and thus, the information processing system 1300 may be able to reliably store a large amount of data in the memory system 1310. This increase in reliability may enable the memory system 1310 to conserve resources for error correction and realize a high speed data exchange function. Although not shown in the drawing, it will be apparent to those of ordinary skill in the art that the information processing system 1300 may be also configured to include an application chipset, a camera image processor (CIS), and/or an input/output device.

According to example embodiments of the inventive concept, the liner insulating layer may be formed through the pores of the porous insulating layer, after the formation of the air gaps. Accordingly, it is possible to reduce non-uniformity in size of the air gaps and the risk of consequent process failure. In addition, the porous insulating layer can have an increased density as the result of the formation of the liner insulating layer, and thus, it may be unnecessary to perform an additional densification process to the porous insulating layer. Accordingly, the fabrication process can be simplified.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming trenches in a substrate and lower gate patterns on the substrate between the trenches;
    forming sacrificial patterns filling the trenches;
    forming a porous insulating layer on the lower gate patterns to cover top surfaces of the sacrificial patterns;
    removing the sacrificial patterns through pores formed in the porous insulating layer to form air gaps surrounded by the trenches and the porous insulating layer; and
    forming a liner insulating layer on inner surfaces of the trenches through the pores of the porous insulating layer.

2. The method of claim 1, wherein the forming of the liner insulating layer comprises supplying silicon source gas and reaction gas on the porous insulating layer, wherein the silicon source and the reaction gas pass through the pores and are reacted with each other on the inner surfaces of the trenches.

3. The method of claim 2, wherein the silicon source gas is one of hexachloro disilane (HCD; $Si_2Cl_6$), dichlorosilane (DCS; $SiCl_2H_2$), tetraisocyanate silane (TICS; $Si(NCO)_4$), tetraethyl orthosilane (TEOS), silane ($SiH_4$), disilane ($Si_2H_6$), or trichlorosilane (TCS).

4. The method of claim 2, wherein the reaction gas comprises oxygen or nitrogen gas.

5. The method of claim 1, wherein the liner insulating layer is formed by a thermal CVD process or an ALD process.

6. The method of claim 1, wherein the porous insulating layer is formed to have a thickness ranging from about 1 Å to about 40 Å.

7. The method of claim 1, wherein a thickness of the porous insulating layer is reduced after the forming of the liner insulating layer.

8. The method of claim 1, wherein the liner insulating layer is formed to cover a sidewall of the porous insulating layer.

9. The method of claim 8, wherein the liner insulating layer is thinner on the sidewall of the porous insulating layer than on the inner surfaces of the trenches.

10. The method of claim 1, wherein each of the lower gate patterns comprises a tunnel insulating pattern and a floating gate pattern sequentially stacked on the substrate; and
    a top surface of the sacrificial pattern is positioned at a level higher than a top surface of the tunnel insulating pattern relative to the substrate.

11. A method of fabricating a semiconductor device, comprising:
    forming trenches in a substrate;
    forming sacrificial patterns filling the trenches;
    forming a porous insulating layer on the sacrificial patterns;
    removing the sacrificial patterns through pores formed in the porous insulating layer to form air gaps surrounded by the trenches and the porous insulating layer; and
    forming a liner insulating layer on inner surfaces of the trenches through the pores of the porous insulating layer so as to increase a density of the porous insulating layer.

12. The method of claim 11, wherein forming the liner insulating layer comprises:
    reducing a thickness of the porous insulating layer.

13. The method of claim 11, wherein forming the liner insulating layer comprises:
    reducing a mean of the pores and/or a number of the pores in the porous insulating layer.

14. The method of claim 11, further comprising:
    forming gate patterns on the substrate on opposing sides of the trenches.

15. The method of claim 14, wherein forming the porous insulating layer comprises:
    forming the porous insulating layer on the gate patterns.

* * * * *